(12) United States Patent
Han

(10) Patent No.: US 11,454,676 B2
(45) Date of Patent: Sep. 27, 2022

(54) APPARATUS FOR ESTIMATING STATE OF SECONDARY BATTERY, AND BATTERY PACK INCLUDING THE SAME

(71) Applicant: LG CHEM, LTD., Seoul (KR)

(72) Inventor: Song-Yi Han, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 410 days.

(21) Appl. No.: 16/616,617

(22) PCT Filed: Dec. 19, 2018

(86) PCT No.: PCT/KR2018/016256
§ 371 (c)(1),
(2) Date: Nov. 25, 2019

(87) PCT Pub. No.: WO2019/160232
PCT Pub. Date: Aug. 22, 2019

(65) Prior Publication Data
US 2020/0182944 A1    Jun. 11, 2020

(30) Foreign Application Priority Data

Feb. 19, 2018  (KR) .................... 10-2018-0019430

(51) Int. Cl.
*G01R 31/392*     (2019.01)
*G01R 31/3835*    (2019.01)
(Continued)

(52) U.S. Cl.
CPC ......... *G01R 31/392* (2019.01); *G01R 31/364* (2019.01); *G01R 31/3835* (2019.01); *H01M 10/48* (2013.01)

(58) Field of Classification Search
None
See application file for complete search history.

(56) References Cited

U.S. PATENT DOCUMENTS

2004/0038123 A1* 2/2004 Hisamitsu ............. H01M 10/48
                                                            429/61
2006/0057433 A1   3/2006 Ando et al.
(Continued)

FOREIGN PATENT DOCUMENTS

CN    103457003 A    12/2013
CN    106062994 A    10/2016
(Continued)

OTHER PUBLICATIONS

International Search Report issued in corresponding International Patent Application No. PCT/KR2018/016256, dated Apr. 22, 2019.
(Continued)

*Primary Examiner* — Jas A Sanghera
(74) *Attorney, Agent, or Firm* — Morgan, Lewis & Bockius LLP

(57) ABSTRACT

An apparatus for estimating a state of a secondary battery, connectable to a positive electrode lead, a negative electrode lead, a first measuring lead, and a second measuring lead in the secondary battery, including: a terminal case including: inner terminals contactable with the positive electrode lead, the negative electrode lead, the first measuring lead, or the second measuring lead on a first surface of the terminal case, and outer terminals respectively electrically connectable to the inner terminals on a second surface facing the first surface of the terminal case, a voltage measuring unit electrically connected to at least two of the outer terminals, and measuring a potential difference between the first and the second measuring lead, and a control unit estimating a state of health of the secondary battery based on the potential difference between the first measuring lead and the second measuring lead.

8 Claims, 15 Drawing Sheets

(51) Int. Cl.
*G01R 31/364* (2019.01)
*H01M 10/48* (2006.01)

(56) References Cited

U.S. PATENT DOCUMENTS

| | | | |
|---|---|---|---|
| 2007/0139013 A1* | 6/2007 | Seo | B60W 10/26 |
| | | | 320/130 |
| 2009/0302804 A1* | 12/2009 | Park | H01M 50/572 |
| | | | 429/178 |
| 2013/0009604 A1 | 1/2013 | Bhardwaj et al. | |
| 2013/0314050 A1 | 11/2013 | Matsubara et al. | |
| 2014/0074416 A1 | 3/2014 | Park et al. | |
| 2016/0252583 A1 | 9/2016 | Joe | |
| 2017/0069898 A1 | 3/2017 | Shimizu et al. | |
| 2017/0146609 A1 | 5/2017 | Uchino et al. | |
| 2020/0182944 A1 | 6/2020 | Han | |

FOREIGN PATENT DOCUMENTS

| | | |
|---|---|---|
| CN | 209344269 U | 9/2019 |
| DE | 10-2011-120512 A | 6/2013 |
| EP | 1 577 914 A | 9/2005 |
| EP | 2 131 412 A2 | 12/2009 |
| JP | 2000-223164 A | 8/2000 |
| JP | 2005-345424 A | 12/2005 |
| JP | 2010-218877 A | 9/2010 |
| JP | 2013-201358 A | 10/2013 |
| JP | 2015-230193 A | 12/2015 |
| KR | 10-2013-0105123 A | 9/2013 |
| KR | 10-2015-0040463 A | 4/2015 |
| KR | 10-2015-0043216 A | 4/2015 |
| KR | 10-2016-0027718 A | 3/2016 |
| KR | 10-2016-0041679 A | 4/2016 |
| KR | 10-2016-0121179 A | 10/2016 |

OTHER PUBLICATIONS

Extended European Search Report dated Oct. 23, 2020, issued in corresponding European Patent Application No. 18906056.9.

Office Action dated Jan. 12, 2021, issued in corresponding Japanese Patent Application No. 2019-568723.

Office Action dated Apr. 28, 2022 issued by the Chinese Patent Office in corresponding Chinese Patent Application No. 201910111420.X.

* cited by examiner

APPARATUS FOR ESTIMATING STATE OF SECONDARY BATTERY, AND BATTERY PACK INCLUDING THE SAME

CROSS-REFERENCE TO RELATED APPLICATION

The present application claims the benefit of Korean Patent Application No. 10-2018-0019430 filed on Feb. 19, 2018 with the Korean Intellectual Property Office, the disclosure of which is incorporated herein by reference in its entirety.

BACKGROUND OF THE DISCLOSURE

Field of the Disclosure

The present disclosure relates to an apparatus for estimating a state of health of a secondary battery, and a battery pack including the same.

Description of the Related Art

Recently, there is dramatically growing demand for portable electronic products such as laptop computers, video cameras and mobile phones, and with the intense development of electric vehicles, accumulators for energy storage, robots and satellites, many studies are being made on high performance secondary batteries that can be recharged repeatedly.

Currently, commercially available secondary batteries include nickel-cadmium batteries, nickel-hydrogen batteries, nickel-zinc batteries, lithium secondary batteries and the like, and among them, lithium secondary batteries have little or no memory effect, and thus they are gaining more attention than nickel-based secondary batteries for their advantages of free charging and discharging, a very low self-discharge rate and high energy density.

The lithium secondary battery mainly uses lithium-based oxide and a carbon material for a positive electrode active material and a negative electrode active material respectively. The lithium secondary battery includes an electrode assembly including a positive electrode plate and a negative electrode plate coated respectively with the positive electrode active material and the negative electrode active material with a separator interposed between, and a packaging material, i.e., a battery case hermetically sealed to receive the electrode assembly therein together with an electrolyte solution.

In general, lithium secondary batteries may be classified into can-type secondary batteries in which an electrode assembly is embedded in a metal can and pouch-type secondary batteries in which an electrode assembly is embedded in a pouch of an aluminum laminate sheet, according to the shape of the packaging material. These secondary batteries are usually manufactured by receiving the electrode assembly in the packaging material, and in this state, injecting an electrolyte solution, and sealing the packaging material.

More recently, with the extended application range of pouch-type secondary batteries, pouch-type secondary batteries are being widely used in small portable devices including smart phones, as well as medium- and large-scale devices such as electric vehicles including hybrid vehicles or energy storage systems.

In the case of a secondary battery, as the usage period increases, the performance degrades compared to initial state. Additionally, performance degradation estimation of the secondary battery is said to be State Of Health (SOH) estimation of the secondary battery, and the SOH of the secondary battery is an important factor in determining when to replace the secondary battery.

Additionally, the secondary battery may differ in degradation for each secondary battery depending on environments in which the secondary battery is manufactured and used. Additionally, in the case of a battery pack including a plurality of secondary batteries, it is necessary to accurately estimate the life of each secondary battery as the secondary batteries degrade. Typically, a Battery Management System (BMS) is required to accurately estimate the SOH of each secondary battery provided in the battery pack, and based on this, operate the battery pack efficiently.

SUMMARY OF THE DISCLOSURE

The present disclosure is designed under the background of the related art as described above, and therefore the present disclosure is directed to providing an improved apparatus for effectively estimating the SOH of a secondary battery and a battery pack including the same.

These and other objects and advantages of the present disclosure will be understood by the following description and will be apparent from the embodiments of the present disclosure. Additionally, it will be readily understood that the objects and advantages of the present disclosure are realized by the means set forth in the appended claims and combinations thereof.

An apparatus according to an aspect of the present disclosure is for estimating a state of a secondary battery, connectable to a positive electrode lead, a negative electrode lead, a first measuring lead and a second measuring lead included in the secondary battery. The apparatus includes a terminal case including a plurality of inner terminals, each of the plurality of inner terminals configured to be contactable with the positive electrode lead, the negative electrode lead, the first measuring lead, or the second measuring lead on a first surface of the terminal case, and a plurality of outer terminals configured to be respectively electrically connectable to the plurality of inner terminals on a second surface facing the first surface of the terminal case; a voltage measuring unit configured to be electrically connectable to at least two of the plurality of outer terminals, and measure a potential difference between the first measuring lead and the second measuring lead; and a control unit configured to estimate a state of health of the secondary battery using the potential difference between the first measuring lead and the second measuring lead measured by the voltage measuring unit.

The plurality of inner terminals may include inner charging/discharging terminals. The inner charging/discharging terminals may include a first inner positive electrode terminal configured to be connectable to each of the first measuring lead, the second measuring lead and the positive electrode lead, and a first inner negative electrode terminal configured to be connectable to the negative electrode lead.

The plurality of inner terminals may include an inner measuring terminals. The inner measuring terminals may include a second inner positive electrode terminal configured to be connectable to the positive electrode lead, a second inner negative electrode terminal configured to be connectable to the negative electrode lead, a first inner measuring terminal configured to be connectable to the first measuring lead, and a second inner measuring terminal configured to be connectable to the second measuring lead.

The plurality of outer terminals may include an outer positive electrode terminal electrically connectable to each of the first inner positive electrode terminal and the second inner positive electrode terminal, and an outer negative electrode terminal electrically connectable to each of the first inner negative electrode terminal and the second inner negative electrode terminal.

The plurality of outer terminals may include a first outer measuring terminal electrically connectable the first inner measuring terminal, and a second outer measuring terminal electrically connectable to the second inner measuring terminal.

The apparatus may further include a switching element configured to selectively change the electrical connection between each of the negative electrode lead, the first measuring lead, the second measuring lead and the positive electrode lead, and the plurality of inner terminals.

The switching element may include a normal mode circuit and a measurement mode circuit. The normal mode circuit may be configured to electrically connect each of the negative electrode lead, the first measuring lead, the second measuring lead and the positive electrode lead to the inner charging/discharging terminal. The measurement mode circuit may be configured to electrically connect each of the negative electrode lead, the first measuring lead, the second measuring lead and the positive electrode lead to the inner measuring terminal.

A battery pack according to another aspect of the present disclosure includes the above-described apparatus for estimating the state of the secondary battery.

According to the apparatus in accordance with the embodiments of the present disclosure, there may be provided a terminal case equipped with a plurality of terminals to accurately measure a potential difference between two electrode plates included in a secondary battery.

Particularly, there is an advantage—it is possible to estimate the SOH of the secondary battery rapidly in a simple and convenient manner while the secondary battery is being used in normal condition, by selectively running a normal mode in which the secondary battery is charged/discharged and a measurement mode in which the SOH of the secondary battery is estimated.

The present disclosure may have a variety of other effects, and these and other effects of the present disclosure can be understood by the following description and will be apparent from the embodiments of the present disclosure.

BRIEF DESCRIPTION OF THE DRAWINGS

The accompanying drawings illustrate preferred embodiments of the present disclosure, and together with the following detailed description, serve to provide a further understanding of the technical aspects of the present disclosure. However, the present disclosure is not to be construed as being limited to the drawings.

DESCRIPTION OF THE PREFERRED EMBODIMENT

Figure 1:
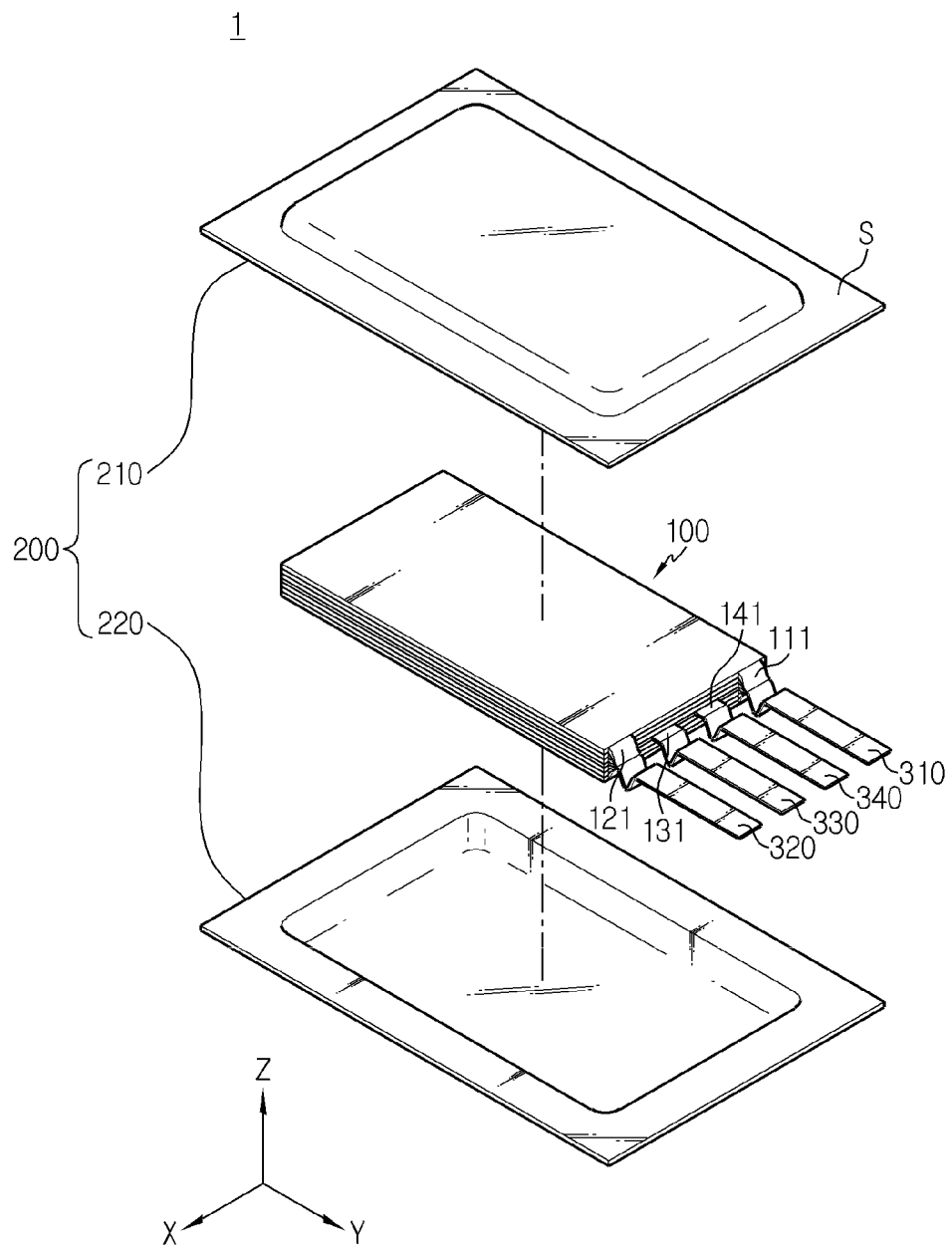
FIG. 1 is a schematic exploded perspective view showing the configuration of a secondary battery according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that other equivalents and modifications could be made thereto at the time of filing the application.

Additionally, in describing the present disclosure, when it is deemed that a certain detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. Additionally, the term 'control unit' as used herein refers to a processing unit of at least one function or operation, and this may be implemented by hardware or software alone or in combination.

In addition, throughout the specification, it will be further understood that when an element is referred to as being "connected to" another element, it can be directly connected to the other element or intervening elements may be present.

Figure 2:
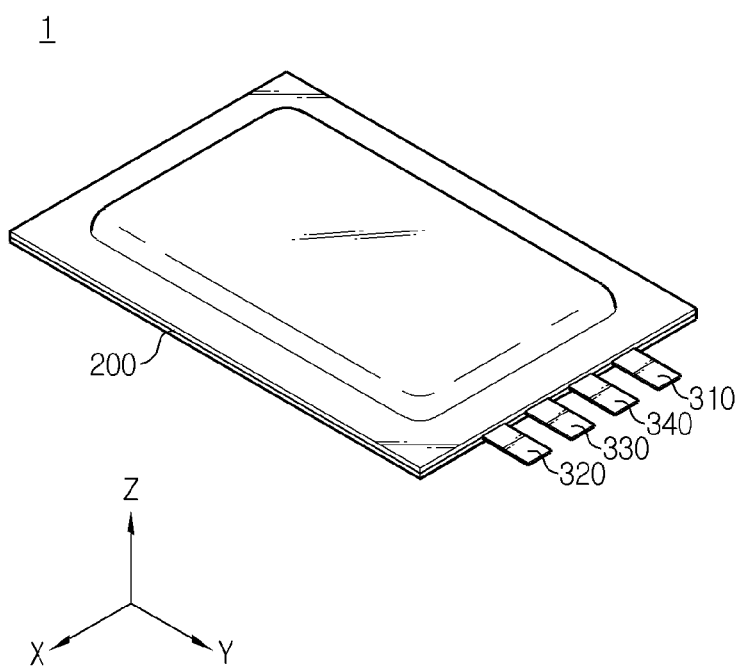
FIG. 2 is an assembled perspective view of FIG. 1.

FIG. 1 is a schematic exploded perspective view showing the configuration of a secondary battery according to an embodiment of the present disclosure, and FIG. 2 is an assembled perspective view of FIG. 1.

Referring to FIGS. 1 and 2, the secondary battery 1 may be a pouch-type secondary battery, and includes a packaging material 200, an electrode assembly 100, a first electrode lead 310, a second electrode lead 320, a first measuring lead 330 and a second measuring lead 340.

The packaging material 200 may have a concave internal space, and the electrode assembly 100 and an electrolyte solution may be received in the internal space.

The packaging material 200 may include an upper pouch 210 and a lower pouch 220, and in this case, the concave internal space may be formed in both the upper pouch 210 and the lower pouch 220 as shown in the drawing.

Additionally, the packaging material 200 may be formed by sealing the outer periphery of the upper pouch 210 and the lower pouch 220. That is, each of the upper pouch 210 and the lower pouch 220 may have a sealing part S at the edges of the internal space, and the internal space of the packaging material 200 may be hermetically closed by sealing the sealing part S by heat fusion.

The electrode assembly 100 includes at least one separator, a plurality of first electrode plates 110, a plurality of second electrode plates 120, a plurality of first electrode tabs 111, a plurality of second electrode tabs 121, a first measuring electrode plate 130, a second measuring electrode plate 140, a first measuring tab 131 and a second measuring tab 141.

The first electrode plate 110 may be a positive electrode plate and the second electrode plate 120 may be a negative electrode plate. In this case, the first electrode tab 111 may be referred to as a positive electrode tab and the second electrode tab 121 may be referred to as a negative electrode tab.

Alternatively, the first electrode plate 110 may be a negative electrode plate and the second electrode plate 120 may be a positive electrode plate. In this case, the first electrode tab 111 may be referred to as a negative electrode tab and the second electrode tab 121 may be referred to as a positive electrode tab.

The plurality of first electrode plates 110 and the plurality of second electrode plates 120 stacked in an alternating manner with the separator interposed between is received in the internal space of the packaging material 200. More specifically, the electrode assembly 100 may be formed by stacking the plurality of first electrode plates 110 and the plurality of second electrode plates 120 in an alternating manner.

The electrode assembly 100 may include the first electrode plate 110 and the second electrode plate 120 stacked with their wide surfaces facing each other with respect to the separator interposed between. That is, the electrode assembly 100 may include the first electrode plate 110 and the second electrode plate 120 stacked in an alternating manner with the separator interposed between, and the first electrode plate 110 and the second electrode plate 120 are spaced a predetermined distance apart from each other by the separator. Additionally, the first electrode plate 110 and the second electrode plate 120 are formed by applying an active material slurry to a current collector, and the slurry may be generally formed by shaking a particulate active material, an auxiliary conductor, a binder and a plasticizer with an addition of solvents.

The first electrode tab 111 and the second electrode tab 121 extend from the plurality of first electrode plates 110 and the plurality of second electrode plates 120 respectively. More specifically, the first electrode plate 110 and the second electrode plate 120 provided in the electrode assembly 100 may have respectively the first electrode tab 111 and the second electrode tab 121 in a non-coated region where the active material is not coated. For example, the first electrode tab 111 and the second electrode tab 121 may extend out of the electrode plates 110, 120 respectively, and may be formed by cutting the electrode plate or attaching a metal plate of a same or different material to the electrode plate.

The first measuring electrode plate 130 and the second measuring electrode plate 140 may have the same polarity. For example, both the first measuring electrode plate 130 and the second measuring electrode plate 140 may have the same polarity as any one of the first electrode plate 110 and the second electrode plate 120.

Each of the first measuring electrode plate 130 and the second measuring electrode plate 140 may be formed by applying a positive electrode active material to the surface of an aluminum current collector. Alternatively, each of the first measuring electrode plate and the second measuring electrode plate may be formed by applying a negative electrode active material to the surface of an aluminum current collector.

Particularly, the first measuring electrode plate 130 and the second measuring electrode plate 140 are provided at the position of the first electrode plate 110 or the second electrode plate 120 in place of at least one electrode plate of the plurality of first electrode plates 110 and the plurality of second electrode plates 120.

The first measuring electrode plate 130 and the second measuring electrode plate 140 may be provided at the position of the first electrode plate 110 or the second electrode plate 120 in place of at least one first electrode plate 110 or second electrode plate 120 of the plurality of first electrode plates 110 and the plurality of second electrode plates 120 stacked in an alternating manner in up-down direction.

For example, the first measuring electrode plate 130 and the second measuring electrode plate 140 may be provided at the position of the first electrode plate 110 in place of the first electrode plate 110.

Alternatively, the first measuring electrode plate 130 and the second measuring electrode plate 140 may be provided at the position of the second electrode plate 120 in place of the second electrode plate 120.

The first measuring tab 131 and the second measuring tab 141 are electrically connected to the first measuring electrode plate 130 and the second measuring electrode plate 140 respectively. Here, the first measuring tab 131 and the second measuring tab 141 may extend from the first measuring electrode plate 130 and the second measuring electrode plate 140 respectively. More specifically, the first measuring electrode plate 130 and the second measuring electrode plate 140 provided in the electrode assembly 100 may have respectively the first measuring tab 131 and the second measuring tab 141 in the non-coated region where the active material is not coated. For example, the first measuring tab 131 and the second measuring tab 141 may extend out of the first measuring electrode plate 130 and the second measuring electrode plate 140 respectively. The first measuring tab 131 may be formed by cutting the first measuring electrode plate 130 or attaching a metal plate of a same or different material to the first measuring electrode plate 130. The second measuring tab 141 may be formed by cutting the second measuring electrode plate 140 or attaching a metal plate of a same or different material to the second measuring electrode plate 140.

One end of the first electrode lead 310 electrically contacts with the plurality of first electrode tabs 111. The other end of the first electrode lead 310 is exposed outside of the packaging material 200. Additionally, a portion between one end and the other end of the first electrode lead 310 is inserted into the packaging material 200. More specifically, the plurality of first electrode tabs 111 extending out of each of the plurality of first electrode plates 110 may be connected to the first electrode lead 310 in contact with each other. The connection between the plurality of first electrode tabs 111 and/or the connection between the first electrode tab 111 and the first electrode lead 310 may be carried out by a welding process. For example, as shown in the configuration of FIG. 1, the first electrode lead 310 may be directly connected to the plurality of first electrode tabs 111 extending out of the plurality of first electrode plates 110.

Additionally, the first electrode lead 310 may be interposed between the upper pouch 210 and the lower pouch 220 such that parts of the first electrode lead 310 may be disposed in the internal space of the packaging material 200. Additionally, the other parts of the first electrode lead 310 may be exposed outside of the packaging material 200. For example, as shown in the configuration of FIG. 2, the first electrode lead 310 may extend in the outward direction of the packaging material 200 with the parts of the first electrode lead 310 exposed outside of the packaging material 200.

One end of the second electrode lead 320 electrically contacts with the second electrode tab 121. The other end of the second electrode lead 320 is exposed outside of the packaging material 200. Additionally, a portion between one end and the other end of the second electrode lead 320 is inserted into the packaging material 200. More specifically, the plurality of second electrode tabs 121 extending out of each of the plurality of second electrode plates 120 may be connected to the second electrode lead 320 in contact with each other. The connection between the plurality of second electrode tabs 121 and/or the connection between the second electrode tab 121 and the second electrode lead 320 may be carried out by a welding process. For example, as shown in the configuration of FIG. 1, the second electrode lead 320 may be directly connected to the plurality of second electrode tabs 121 extending out of the plurality of second electrode plates 120.

Additionally, the second electrode lead 320 may be interposed between the upper pouch 210 and the lower pouch 220 such that parts of the second electrode lead 320 may be disposed in the internal space of the packaging material 200. Additionally, the other parts of the second electrode lead 320 may be exposed outside of the packaging material 200. For example, as shown in the configuration of FIG. 2, the second electrode lead 320 may extend in the outward direction of the packaging material 200, with the parts of the second electrode lead 320 exposed outside of the packaging material 200.

When the first electrode tab 111 is a positive electrode tab and the second electrode tab 121 is a negative electrode tab, the first electrode lead 310 may be referred to as a positive electrode lead and the second electrode lead 320 may be referred to as a negative electrode lead.

Alternatively, when the first electrode tab 111 is a negative electrode tab and the second electrode tab 121 is a positive electrode tab, the first electrode lead 310 may be referred to as a negative electrode lead and the second electrode lead 320 may be referred to as a positive electrode lead.

One end of the first measuring lead 330 electrically contacts with the first measuring tab 131. The other end of the first measuring lead 330 is exposed outside of the packaging material 200. Additionally, parts of the first measuring lead 330 are inserted into the packaging material 200. More specifically, the first measuring tab 131 extending out of the first measuring electrode plate 130 may be connected to the first measuring lead 330. The connection between the first measuring tab 131 and the first measuring lead 330 may be carried out by a welding process. For example, as shown in the configuration of FIG. 1, the first measuring lead 330 may be directly connected to the first measuring tab 131 extending out of the first measuring electrode plate 130.

Additionally, the first measuring lead 330 may have the central part interposed between the upper pouch 210 and the lower pouch 220, and parts of the first measuring lead 330 may be disposed in the internal space of the packaging material 200. Additionally, the other parts of the first measuring lead 330 may be exposed outside of the packaging material 200. For example, as shown in the configuration of FIG. 2, the first measuring lead 330 may extend in the outward direction of the packaging material 200, with the parts of the first measuring lead 330 exposed outside of the packaging material 200.

One end of the second measuring lead 340 electrically contacts with the second measuring tab 141. The other end of the second measuring lead 340 is exposed outside of the packaging material 200. Additionally, parts of the second measuring lead 340 are inserted into the packaging material 200. More specifically, the second measuring tab 141 extending out of the second measuring electrode plate 140 may be connected to the second measuring lead 340. In this instance, the connection between the second measuring tab 141 and the second measuring lead 340 may be carried out by a welding process. For example, as shown in the configuration of FIG. 1, the second measuring lead 340 may be directly connected to the second measuring tab 141 extending out of the second measuring electrode plate 140.

Additionally, the second measuring lead 340 may have the central part interposed between the upper pouch 210 and the lower pouch 220, and parts of the second measuring lead 340 may be disposed in the internal space of the packaging material 200. Additionally, the other parts of the second measuring lead 340 may be exposed outside of the packaging material 200. For example, as shown in the configuration of FIG. 2, the second measuring lead 340 may extend in the outward direction of the packaging material 200, with the parts of the second measuring lead 340 exposed outside of the packaging material 200.

According to the present disclosure, it is possible to estimate the state of the secondary battery using the first measuring lead 330 and the second measuring lead 340. Particularly, the SOH (state of health) of the secondary battery may be estimated based on a potential difference between the first measuring lead and the second measuring lead.

The first measuring tab 131 and the first measuring lead 330 may be integrated into one plate. The second measuring tab 141 and the second measuring lead 340 may be integrated into one plate.

Additionally, the first electrode lead 310, the second electrode lead 320, the first measuring lead 330 and the second measuring lead 340 may extend out of the packaging material 200 in the same direction. For example, as shown in the configuration of FIGS. 1 and 2, the first electrode lead 310, the second electrode lead 320, the first measuring lead 330 and the second measuring lead 340 may extend in +y-axis direction of FIGS. 1 and 2.

Accordingly, it is possible to easily measure the voltage (i.e. the potential difference) using the first measuring lead and the second measuring lead. The reason is that the first measuring lead and the second measuring lead may easily contact a measuring terminal as described below.

In the electrode assembly 100, the positions of the first measuring tab 131 and the second measuring tab 141 may be different in the horizontal direction from the positions of the first electrode tab 111 and the second electrode tab 121. For example, as shown in the configuration of FIGS. 1 and 2, the first measuring tab 131 and the second measuring tab 141 may be formed at different positions in the x-axis direction from the first electrode tab 111 and the second electrode tab 121. Particularly, the first measuring tab 131 and the second measuring tab 141 may be provided between the first electrode tab 111 and the second electrode tab 121.

Accordingly, the state of the secondary battery 1 may be easily estimated by the first measuring tab and the second measuring tab formed at different positions in the horizontal direction from the first electrode tab 111 and the second electrode tab 121 used to charge and discharge the secondary battery 1.

Figure 3:
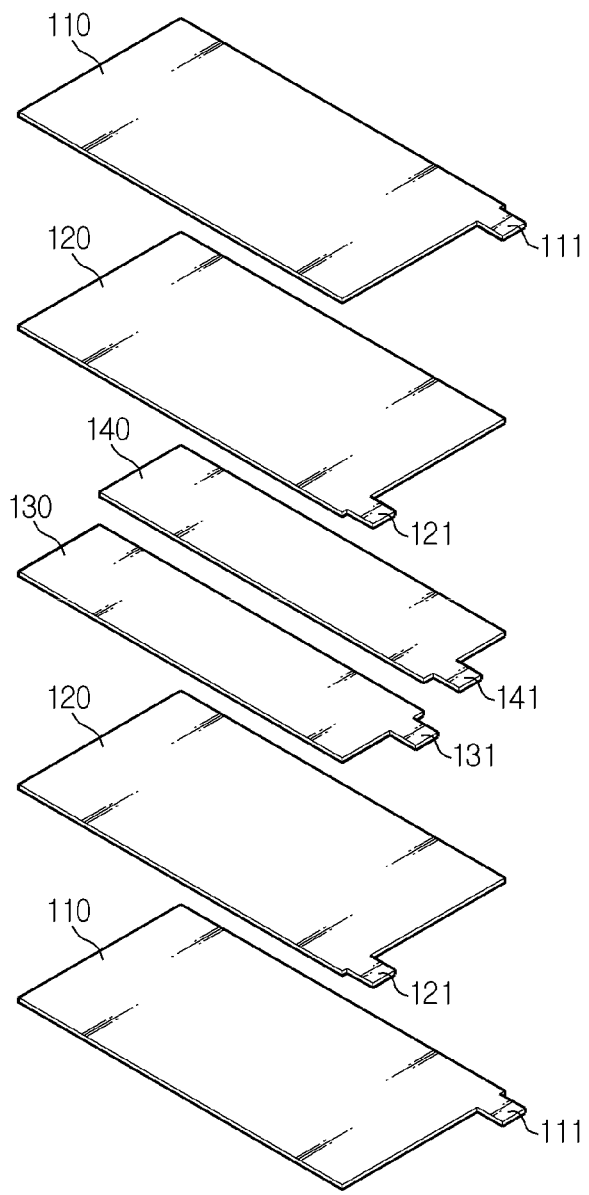
FIG. 3 is a schematic exploded perspective view showing the configuration of an electrode assembly according to an embodiment of the present disclosure.

FIG. 3 is a schematic exploded perspective view showing the configuration of the electrode assembly according to an embodiment of the present disclosure. However, for convenience of description, the separator is not shown in FIG. 3. Additionally, in this embodiment, for the parts to which the description of the previous embodiment may be similarly applied, a detailed description is omitted herein, and it will be described primarily based on difference(s).

Referring to FIG. 3, the electrode assembly 100 may be configured such that a plurality of electrode plates 110, 120, 130, 140 is stacked in up-down direction. Particularly, the first measuring electrode plate 130 and the second measuring electrode plate 140 may be provided at the position of the first electrode plate 110 or the second electrode plate 120 in place of at least one electrode plate of the plurality of first electrode plates 110 and the plurality of second electrode plates 120. More specifically, the first measuring electrode plate 130 and the second measuring electrode plate 140 may be stacked in the same layer among the plurality of electrode plates.

For example, as shown in the configuration of FIG. 3, the first measuring electrode plate 130 and the second measuring electrode plate 140 may be provided at the position of the first electrode plate 110 in place of the first electrode plate 110. That is, the first measuring electrode plate 130 and the second measuring electrode plate 140 may be provided in the same layer between two second electrode plates 120. Additionally, although not shown in the drawing, the first measuring electrode plate 130 and the second measuring electrode plate 140 may be provided at the position of the second electrode plate 120 in place of the second electrode plate 120. That is, the first measuring electrode plate 130 and the second measuring electrode plate 140 may be provided in the same layer between two first electrode plates 110. According to this configuration of the present disclosure, it is possible to estimate the state of the secondary battery more accurately.

The electrode assembly 100 may further include an insulating element 150. This will be described in more detail with reference to FIGS. 4 and 5.

Figure 4:
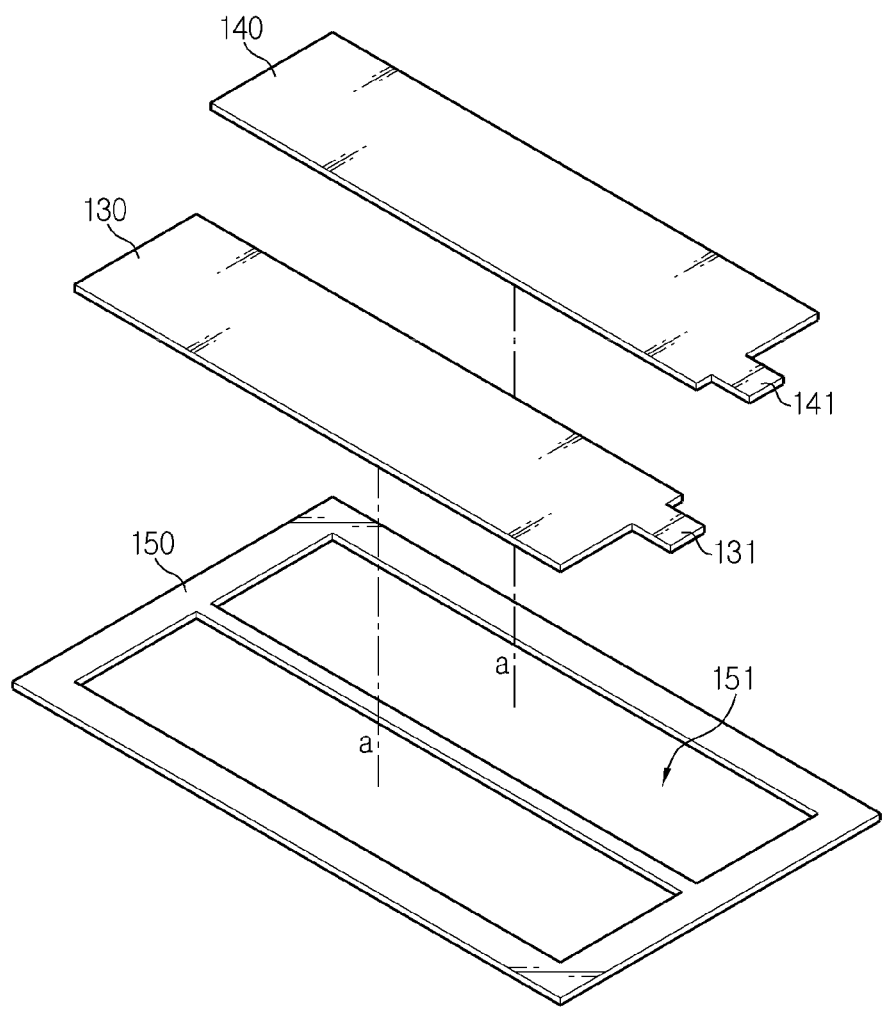
FIGS. 4 and 5 are schematic perspective views showing connection of a measuring electrode plate and an insulating element according to different embodiments of the present disclosure.
Figure 5:
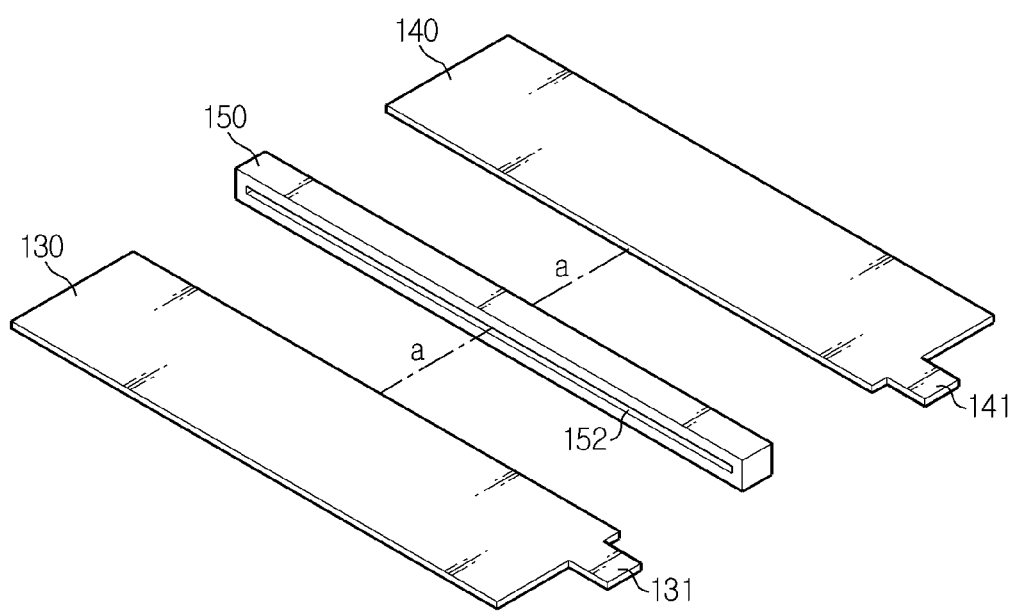

FIGS. 4 and 5 are schematic perspective views showing connection of the measuring electrode plates 130, 140 and the insulating element 150 according to different embodiments of the present disclosure.

Referring to FIGS. 4 and 5, the insulating element 150 may fix the first measuring electrode plate 130 and the second measuring electrode plate 140. More specifically, the insulating element 150 may fix the first measuring electrode plate 130 and the second measuring electrode plate 140 such that the first measuring electrode plate 130 and the second measuring electrode plate 140 may be disposed in parallel in one layer among the plurality of electrode plates 110, 120.

For example, as shown in the configuration of FIG. 4, the insulating element 150 may be made of an insulating material, and have the same size as the electrode plate provided in the electrode assembly 100. Additionally, the insulating element 150 may have internal spaces 151 of the same size as the area of the first measuring electrode plate 130 and the second measuring electrode plate 140.

The internal space 151 formed in the insulating element 150 may be an empty space that is open in the vertical direction, with the open top and bottom in the same size as the area of the first measuring electrode plate 130 and the second measuring electrode plate 140 as shown in the configuration of FIG. 4. Additionally, the first measuring electrode plate 130 and the second measuring electrode plate 140 may be disposed in the internal space 151. The first measuring electrode plate 130 and the second measuring electrode plate 140 may be inserted and fixed into the internal space 151 of the insulating element 150 along the direction a of FIG. 4. In this instance, the internal space into which the first measuring electrode plate 130 is inserted and the internal space into which the second measuring electrode plate 140 is inserted may be spaced a predetermined distance apart in the horizontal direction. Accordingly, the first measuring electrode plate 130 and the second measuring electrode plate 140 may be kept in electrically insulated state when fixed in the insulating element 150.

Alternatively, as shown in the configuration of FIG. 5, the insulating element 150 may be made of an insulating material and disposed between the first measuring electrode plate 130 and the second measuring electrode plate 140. For example, the insulating element 150 may be formed in the shape of an elongated bar that extends in one direction (the left-right direction in the drawing). Additionally, the insulating element 150 may be interposed between the first measuring electrode plate 130 and the second measuring electrode plate 140 arranged in parallel in the horizontal direction, with the wide surfaces facing up and down, to separate the first measuring electrode plate 130 from the second measuring electrode plate 140. Particularly, through this configuration, the insulating element 150 may electrically insulate the first measuring electrode plate 130 from the second measuring electrode plate 140. According to this configuration of the present disclosure, insulation between the two measuring electrode plates 130, 140 may be maintained.

The insulating element 150 may be configured such that the first measuring electrode plate 130 and the second measuring electrode plate 140 may be inserted into the insulating element 150. More specifically, the insulating element 150 may have an inner grooves 152. The inner groove 152 may extend in the lengthwise direction of the first measuring electrode plate 130 and the second measuring electrode plate 140 such that the first measuring electrode plate 130 and the second measuring electrode plate 140 are coupled to the inner grooves 152. Here, the first measuring electrode plate 130 and the second measuring electrode plate 140 may be inserted and fixed into the inner grooves 152 of the insulating element 150 in the direction a of FIG. 5.

Additionally, the insulating element 150 may electrically insulate the first measuring electrode plate 130 from the second measuring electrode plate 140. More specifically, the insulating element 150 may separate the first measuring electrode plate 130 from the second measuring electrode plate 140 to maintain a predetermined distance between the first measuring electrode plate 130 and the second measuring electrode plate 140. For example, as shown in the configuration of FIGS. 4 and 5, the first measuring electrode plate 130 and the second measuring electrode plate 140 may be spaced apart by the insulating element 150 to prevent the contact between.

Figure 6:
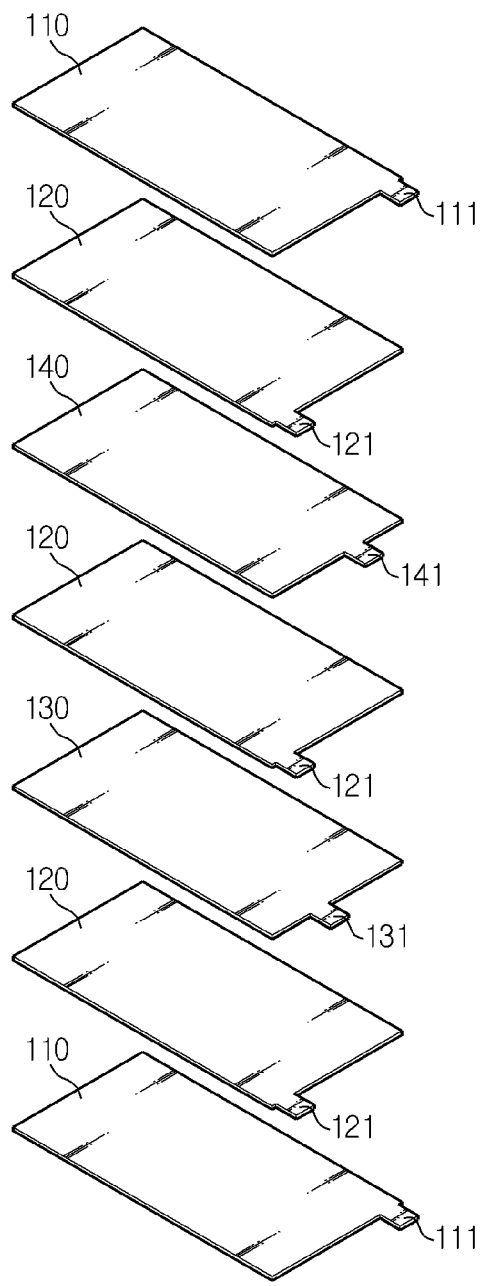
FIG. 6 is a schematic exploded perspective view showing the configuration of an electrode assembly according to another embodiment of the present disclosure.

FIG. 6 is a schematic exploded perspective view showing the configuration of the electrode assembly according to another embodiment of the present disclosure. However, for convenience of description, the separator is not shown in FIG. 6. Additionally, in this embodiment, for the parts to which the description of the previous embodiment may be similarly applied, a detailed description is omitted herein, and it will be described primarily based on difference(s).

Referring to FIG. 6, the electrode assembly 100 may be configured such that a plurality of electrode plates is stacked in up-down direction. Particularly, the first measuring electrode plate 130 and the second measuring electrode plate 140 may be provided at the position of two electrode plates in place of any two of the plurality of first electrode plates 110 or any two of the plurality of second electrode plates 120. More specifically, the first measuring electrode plate 130 and the second measuring electrode plate 140 may be stacked in different layers in place of each separate electrode plate of the plurality of electrode plates.

For example, as shown in the configuration of FIG. 6, the first measuring electrode plate 130 and the second measuring electrode plate 140 may be provided at the position of two first electrode plates 110 in place of the two first electrode plates 110. That is, each of the first measuring electrode plate 130 and the second measuring electrode plate 140 may be provided between the second electrode plates 120, and the first measuring electrode plate 130 and the second measuring electrode plate 140 may be provided in different layers.

Alternatively, although not shown in the drawing, the first measuring electrode plate 130 and the second measuring electrode plate 140 may be provided at the position of two second electrode plates 120 in place of the two second electrode plates 120. That is, each of the first measuring electrode plate 130 and the second measuring electrode plate 140 may be provided between the first electrode plates 110, and the first measuring electrode plate 130 and the second measuring electrode plate 140 may be provided in different layers. According to this configuration of the present disclosure, it is possible to easily manufacture the secondary battery 1.

Figure 7:
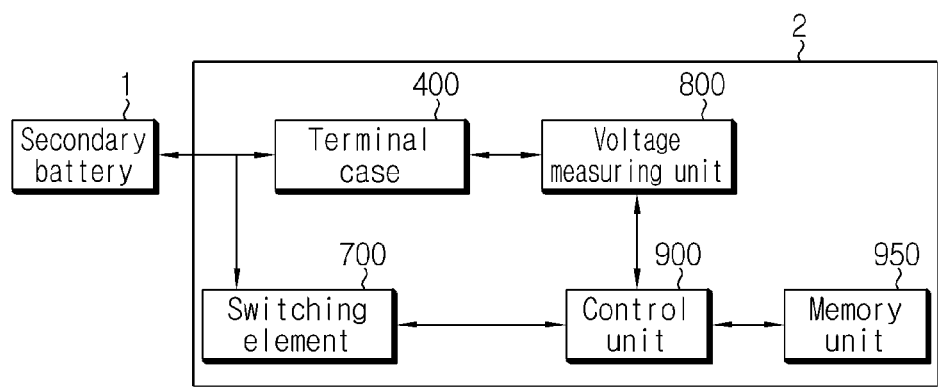
FIG. 7 is a schematic diagram showing the functional configuration of an apparatus for estimating a state of a secondary battery according to an embodiment of the present disclosure.
Figure 8:
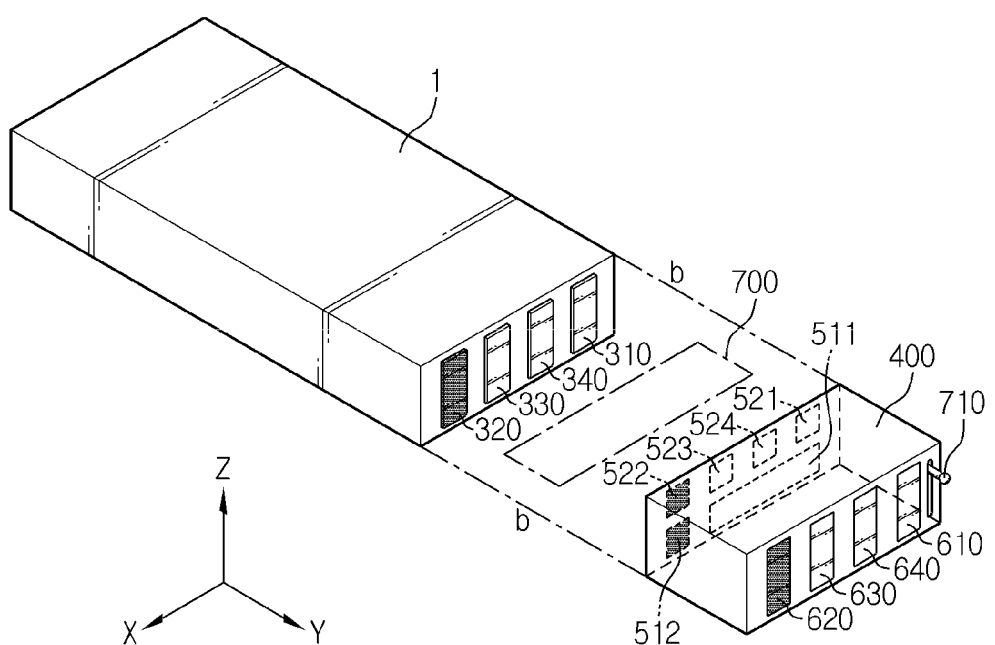
FIG. 8 is a schematic exploded perspective view showing the partial configuration of a secondary battery and an apparatus for estimating a state of a secondary battery according to an embodiment of the present disclosure.
Figure 9:
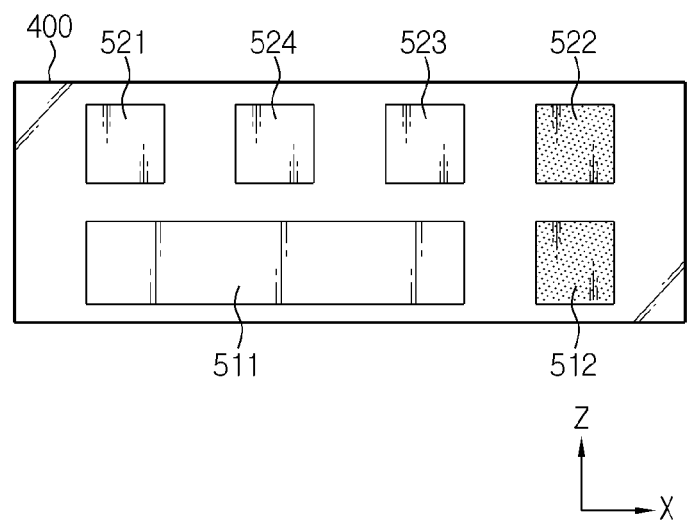
FIGS. 9 and 10 are schematic diagrams showing the configuration of a plurality of inner terminals and a plurality of outer terminals of FIG. 8 respectively.
Figure 10:
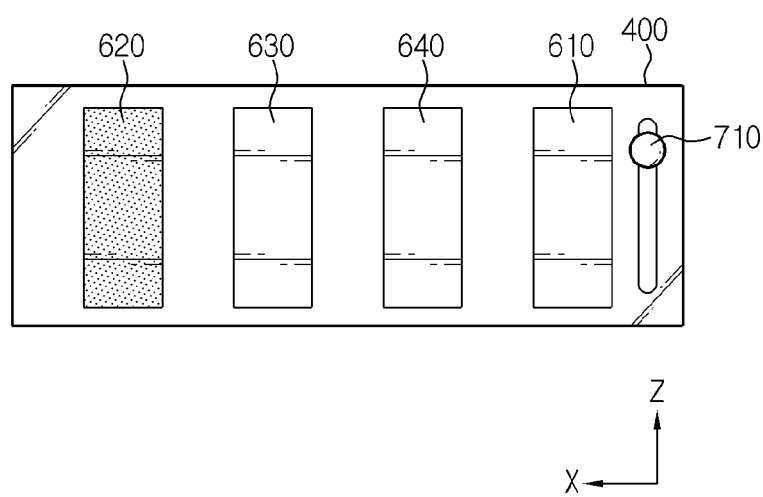

FIG. 7 is a schematic diagram showing the functional configuration of the apparatus 2 for estimating the state of the secondary battery 1 according to an embodiment of the present disclosure, and FIG. 8 is a schematic exploded perspective view showing the partial configuration of the secondary battery 1 and the apparatus 2 for estimating the state of the secondary battery 1 according to an embodiment of the present disclosure. Additionally, FIGS. 9 and 10 are schematic diagrams showing the configuration of each of the plurality of inner terminals and the plurality of outer terminals of FIG. 8.

The apparatus 2 is an apparatus that estimates the state of the secondary battery 1, in particular, degradation of the secondary battery. Additionally, the apparatus 2 may estimate the life (i.e. SOH) of the secondary battery 1 through estimation of the state of the secondary battery 1. Particularly, the apparatus 2 may be electrically connected to each of leads 310, 320, 330, 340 of the secondary battery 1.

The outer surfaces of the secondary battery 1 may be taped. For example, as shown in the configuration of FIG. 8, the secondary battery 1 may be in the shape of a rectangular prism with the taped outer surfaces. Additionally, the secondary battery 1 may have a plurality of leads 310, 320, 330, 340 disposed on one surface of the secondary battery 1. For example, as shown in the configuration of FIG. 8, the secondary battery 1 may include the first electrode lead 310, the second electrode lead 320, the first measuring lead 330 and the second measuring lead 340 on one surface in +y-axis direction of FIG. 8.

The first electrode lead 310, the second electrode lead 320, the first measuring lead 330 and the second measuring lead 340 may be bent in upward or downward direction. Specifically, the first electrode lead 310, the second electrode lead 320, the first measuring lead 330 and the second measuring lead 340 may be bent in upward or downward direction with the flat surface facing in the outward direction of the secondary battery 1. For example, as shown in the configuration of FIG. 8, the first electrode lead 310, the second electrode lead 320, the first measuring lead 330 and the second measuring lead 340 may be bent in +z-axis direction or −z-axis direction, with the flat surface facing in +y-axis direction. Accordingly, the plurality of leads 310, 320, 330, 340 may easily contact with the measuring terminals or the like.

Referring to FIGS. 7 to 10, the apparatus 2 for estimating the state of the secondary battery 1 according to the present disclosure includes a terminal case 400, a voltage measuring unit 800 and a control unit 900.

The terminal case 400 may be provided on one side of the secondary battery 1 and may be coupled to the secondary battery 1. The terminal case 400 may be coupled to one side of the secondary battery 1 having the electrode leads 310, 320, 330, 340. For example, as shown in the configuration of FIG. 8, the terminal case 400 may be located on one side of the secondary battery 1 in the direction b.

The terminal case 400 may have a coupling portion and may be coupled to one side of the secondary battery 1. Although not shown, the terminal case 400 may have the coupling portion extending in the direction of the secondary battery 1 from the terminal case 400 on a surface of −y-axis direction of FIG. 8, and the secondary battery 1 may have a predefined groove to which the coupling portion is fixed. Additionally, when the terminal case 400 approaches the secondary battery 1 in −y-axis direction of FIG. 8, the coupling portion may be fixed into the groove.

The terminal case 400 may include the plurality of inner terminals and the plurality of outer terminals.

The plurality of inner terminals may be made of an electrically conductive material such as metal. Additionally, at least one of the plurality of inner terminals may be formed in the shape of a plate. Additionally, the plurality of inner terminals may be provided on a first surface (e.g., an inner surface) facing the electrode leads 310, 320, 330, 340 of the secondary battery 1. The first surface may be one surface configured to be coupled with the secondary battery 1 in the terminal case 400. For example, as shown in the configuration of FIG. 8, the plurality of inner terminals may be provided on one surface of the terminal case 400 facing the secondary battery 1 in −y-axis direction of FIG. 8.

Additionally, the plurality of inner terminals may be configured to contactable with each of the first electrode lead 310, the second electrode lead 320, the first measuring lead 330 and the second measuring lead 340. More specifically, the plurality of inner terminals may be configured to selectively contact with each of the first electrode lead 310, the second electrode lead 320, the first measuring lead 330 and the second measuring lead 340. The plurality of inner terminals may be configured to selectively contact with the electrode leads 310, 320, 330, 340 of the secondary battery 1 separately in the case of charging/discharging the secondary battery 1 and the case of estimating the state of the secondary battery 1.

The plurality of inner terminals may include an inner charging/discharging terminals and an inner measuring terminals.

The inner charging/discharging terminals may include a first inner positive electrode terminal 511 and a first inner negative electrode terminal 512. The first inner positive electrode terminal 511 may be configured to electrically contact with all the first measuring lead 330, the second measuring lead 340 and the first electrode lead 310. Additionally, the first inner negative electrode terminal 512 may be configured to contact with the second electrode lead 320.

For example, as shown in the configuration of FIGS. 8 and 9, the first inner positive electrode terminal 511 and the first inner negative electrode terminal 512 may be provided at the lower part in −z-axis direction on the inner surface of the terminal case 400 facing the secondary battery 1 in −y-axis direction of FIG. 8. That is, the inner charging/discharging terminals may be provided at the lower part on one surface of the terminal case 400.

When the first measuring lead 330 and the second measuring lead 340 are leads having positive polarity, the first inner positive electrode terminal 511 may be also configured to electrically contact with the first measuring lead 330 and the second measuring lead 340. Additionally, the first inner positive electrode terminal 511 may extend in the widthwise direction such that the first inner positive electrode terminal 511 may contact all the first measuring lead 330, the second measuring lead 340 and the first electrode lead 310. For example, as shown in the configuration of FIGS. 8 and 9, the first inner positive electrode terminal 511 may extend straight in the horizontal direction (x-axis direction).

The first inner negative electrode terminal 512 may be configured to electrically contact with the second electrode lead 320 of the secondary battery 1. To this end, when the terminal case 400 receives the secondary battery 1 or is coupled to the electrode lead of the secondary battery 1, the first inner negative electrode terminal 512 may be disposed at the location facing the second electrode lead 320. For example, as shown in the configuration of FIGS. 8 and 9, the first inner negative electrode terminal 512 may be provided on one side (right side) in +x-axis direction from the first inner positive electrode terminal 511, facing the second electrode lead 320. Although not shown in the drawing, when the first measuring lead 330 and the second measuring lead 340 are leads having the negative polarity, the first inner negative electrode terminal 512 may be also configured to electrically contact with the first measuring lead 330 and the second measuring lead 340. In this case, the first inner negative electrode terminal 512 may extend straight in the widthwise direction (x-axis direction).

The inner measuring terminals may include a second inner positive electrode terminal 521, a second inner negative electrode terminal 522, a first inner measuring terminal 523 and a second inner measuring terminal 524. The second inner positive electrode terminal 521 may be configured to contact with the first electrode lead 310. Additionally, the second inner negative electrode terminal 522 may be configured to contact with the second electrode lead 320. Additionally, the first inner measuring terminal 523 may be configured to contact with the first measuring lead 330. Additionally, the second inner measuring terminal 524 may be configured to contact with the second measuring lead 340.

For example, as shown in the configuration of FIGS. 8 and 9, the second inner positive electrode terminal 521, the second inner negative electrode terminal 522, the first inner measuring terminal 523 and the second inner measuring terminal 524 may be provided at the upper portion in +z-axis direction on one surface of the terminal case 400 facing the secondary battery 1 in −y-axis direction of FIG. 8. That is, the inner measuring terminals may be provided at the upper portion on one surface of the terminal case 400.

When the terminal case 400 receives the secondary battery 1 or is coupled to the electrode leads of the secondary battery 1, the second inner positive electrode terminal 521 may be provided at the location facing the first electrode lead 310. For example, as shown in the configuration of FIGS. 8 and 9, the second inner positive electrode terminal 521 may be provided facing the upper portion of the first electrode lead 310.

The second inner negative electrode terminal 522 may be provided at the location facing the second electrode lead 320. For example, as shown in the configuration of FIGS. 8 and 9, the second inner negative electrode terminal 522 may be provided facing the upper portion of the second electrode lead 320.

When the terminal case 400 receives the secondary battery 1 or is coupled to the electrode leads of the secondary battery 1, the first inner measuring terminal 523 may be provided at the location facing the first measuring lead 330. For example, as shown in the configuration of FIGS. 8 and 9, the first inner measuring terminal 523 may be provided facing the upper portion of the first measuring lead 330.

When the terminal case 400 receives the secondary battery 1 or is coupled to the electrode leads of the secondary battery 1, the second inner measuring terminal 524 may be provided at the location facing the second measuring lead 340. For example, as shown in the configuration of FIGS. 8 and 9, the second inner measuring terminal 524 may be provided facing the upper portion of the second measuring lead 340.

The plurality of outer terminals may be made of an electrically conductive material such as metal. Additionally, the outer terminals may be in the shape of a plate. Additionally, the plurality of outer terminals may be provided on a second surface (e.g., outer surface) provided in the outward direction from the first surface facing the electrode lead of the secondary battery 1. That is, the first surface and the second surface may face or be opposed to each other. Here, the second surface may be a surface of the terminal case 400 facing away from the secondary battery 1. For example, as shown in the configuration of FIG. 8, the plurality of outer terminals may be provided on one surface of the terminal case 400 facing away from the secondary battery 1 in +y-axis direction of FIG. 8.

Additionally, the plurality of outer terminals may be electrically connectable to the plurality of inner terminals respectively. More specifically, the plurality of outer terminals may be configured to selectively contact with the plurality of inner terminals respectively. The plurality of outer terminals may be configured to contact with the plurality of inner terminals separately in each of the case of charging/discharging the secondary battery 1 and the case of estimating the SOH of the secondary battery 1.

The plurality of outer terminals may include an outer charging/discharging terminals and an outer measuring terminals.

The outer charging/discharging terminals may include an outer positive electrode terminal 610 and an outer negative electrode terminal 620. For example, as shown in the configuration of FIGS. 8 and 10, the outer positive electrode terminal 610 may be provided at the edge portion in −x-axis direction on one surface of the terminal case 400. Here, the outer positive electrode terminal 610 may be provided at the location facing the first inner positive electrode terminal 511 and the second inner positive electrode terminal 521. Additionally, the outer negative electrode terminal 620 may be provided at the edge portion in +x-axis direction on one surface of the terminal case 400. Here, the outer negative electrode terminal 620 may be provided at the location facing the first inner negative electrode terminal 512 and the second inner negative electrode terminal 522.

The outer positive electrode terminal 610 may be electrically connected to each of the first inner positive electrode terminal 511 and the second inner positive electrode terminal 521. Additionally, the outer negative electrode terminal 620 may be electrically connected to each of the first inner negative electrode terminal 512 and the second inner negative electrode terminal 522. Its detailed description will be provided in the description of FIG. 13.

The outer measuring terminals may include a first outer measuring terminal 630 and a second outer measuring terminal 640. For example, as shown in the configuration of FIGS. 8 and 10, the first outer measuring terminal 630 and the second outer measuring terminal 640 may be provided between the outer charging/discharging terminals 610, 620. That is, the first outer measuring terminal 630 and the second outer measuring terminal 640 may be provided between the outer positive electrode terminal 610 and the outer negative electrode terminal 620. Here, the first outer measuring terminal 630 may be provided at the location facing the first inner measuring terminal 523. Additionally, the second outer measuring terminal 640 may be provided at the location facing the second inner measuring terminal 524.

The first outer measuring terminal 630 may be electrically connected to the first inner measuring terminal 523. Additionally, the second outer measuring terminal 640 may be electrically connected to the second inner measuring terminal 524. Its detailed description will be provided in the description of FIG. 13.

The voltage measuring unit 800 may be electrically connected to at least two of the plurality of outer terminals to measure the voltage between the two terminals 630, 640. Additionally, the voltage measuring unit 800 may be electrically connected to at least one of the plurality of outer terminals. Additionally, the voltage measuring unit 800 may be electrically connected to the first measuring lead 330 and the second measuring lead 340 through the plurality of outer terminals to measure the voltage of each of the first measuring lead 330 and the second measuring lead 340.

The control unit 900 may be configured to estimate the SOH of the secondary battery based on the potential difference between the first measuring lead 330 and the second measuring lead 340 measured by the voltage measuring unit 800. Additionally, the control unit 900 may receive the voltage value of each of the first measuring lead 330 and the second measuring lead 340 from the voltage measuring unit 800. Through this, the control unit 900 may calculate the potential difference between the voltage values of the first measuring electrode plate 130 and the second measuring electrode plate 140. Additionally, the control unit 900 may estimate the SOH of the secondary battery using the calculated potential difference.

Meanwhile, to perform the above-described operation, the control unit 900 may selectively include a processor, an Application-Specific Integrated Circuit (ASIC), a chipset, a logic circuit, register, a communication modem and/or a data processing device, known in the art.

The apparatus 2 for estimating the state of the secondary battery 1 may further include a memory unit 950 as shown in the configuration of FIG. 7.

The memory unit 950 may include a lookup table that defines the SOH of the secondary battery corresponding to the potential difference between the first measuring electrode plate 130 and the second measuring electrode plate 140. Additionally, the memory unit 950 may include necessary information for the control unit 900 to calculate the potential difference. Here, the control unit 900 may estimate the SOH of the secondary battery using the potential difference-SOH lookup table of the secondary battery 1.

Additionally, the memory unit 950 is not limited to a particular type, and includes any type of storage medium that can record and erase information. For example, the memory unit 950 may be RAM, ROM, register, hard disk, an optical recording medium or a magnetic recording medium. Additionally, the memory unit 950 may be electrically connected to the control unit 900 through, for example, a data bus, to allow the control unit 900 to access. Additionally, the memory unit 950 may store and/or update and/or erase and/or transmit programs including various control logics executed by the control unit 900, and/or data generated when the control logics are executed.

The apparatus 2 for estimating the state of the secondary battery 1 may further include a switching element 700.

The switching element 700 may be provided between the secondary battery 1 and the terminal case 400. That is, the switching element 700 may be provided between the plurality of electrode leads 310, 320, 330, 340 and the plurality of inner terminals 511, 512, 521, 522, 523, 524. Additionally, the switching element 700 may be configured to selectively change the electrical contact between the second electrode lead 320, the first measuring lead 330, the second measuring lead 340 and the first electrode lead 310, and the plurality of inner terminals 511, 512, 521, 522, 523, 524. For example, a switching bar 710 that may control the switching element 700 may be provided on one side of the terminal case 400. Alternatively, the switching element 700 is configured to receive and transmit electrical signals from/to the control unit 900, and may be controlled by the control signals, such as turn-on and/or turn-off, transmitted from the control unit 900.

For example, when the switching bar 710 is provided in the terminal case 400, as shown in the configuration of FIG. 8, the switching bar 710 may be configured to switch a normal mode and a measurement mode. For example, when the switching bar 710 goes up in +z-axis direction, the measurement mode may be selected, and when the switching bar 710 goes down in −z-axis direction, the normal mode may be selected.

Meanwhile, when the switching element 700 is provided between the plurality of electrode leads and the plurality of inner terminals, the switching element 700 may be implemented as an electrical circuit including a plurality of switches. Its detailed description will be provided in the description of FIG. 15.

Figure 11:
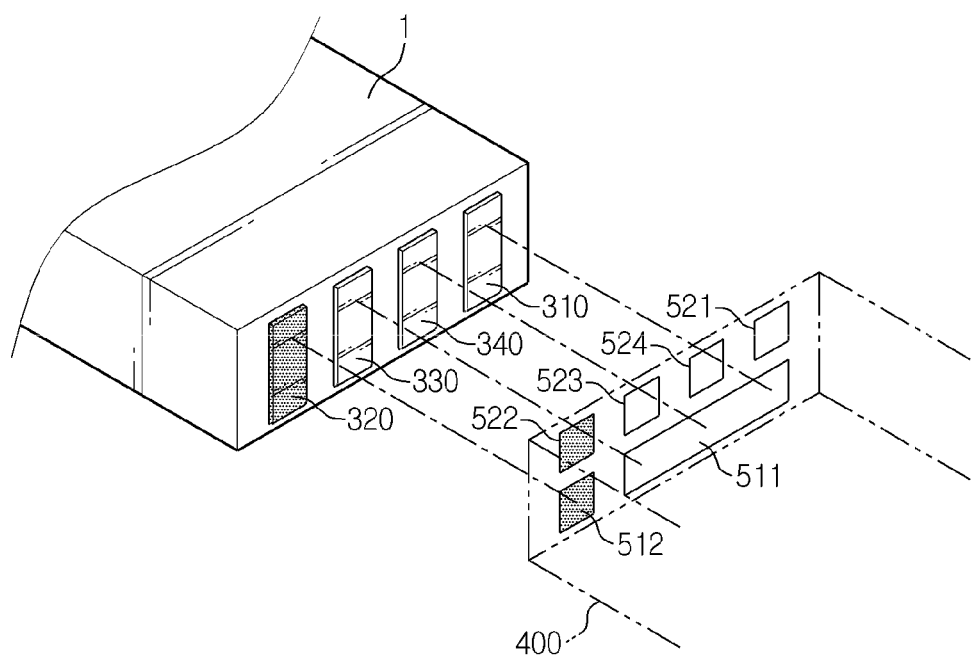
FIGS. 11 and 12 are schematic diagrams showing connection of a plurality of electrode leads and a plurality of inner terminals according to an embodiment of the present disclosure.
Figure 12:
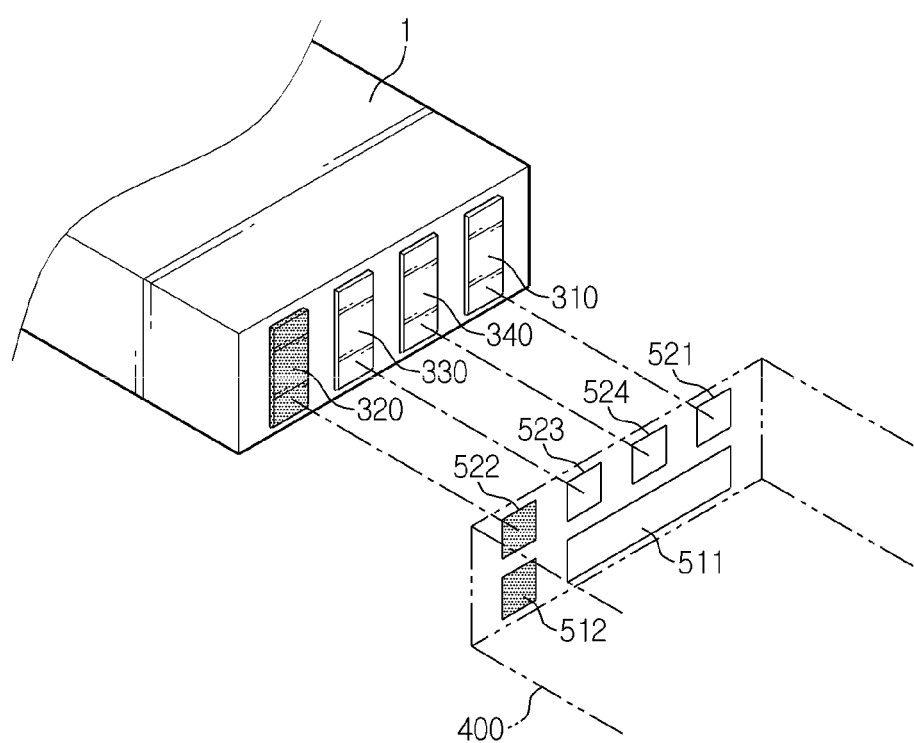

FIGS. 11 and 12 are schematic diagrams showing connection of the plurality of electrode leads 310, 320, 330, 340 and the plurality of inner terminals 511, 512, 521, 522, 523, 524 according to an embodiment of the present disclosure.

First, referring to FIG. 11, the inner charging/discharging terminals 511, 512 may be electrically connected to the plurality of electrode leads of the secondary battery 1.

The first inner positive electrode terminal 511 may be electrically connected to all the first measuring lead 330, the second measuring lead 340 and the first electrode lead 310. In this case, the first measuring lead 330 and the second measuring lead 340 have the positive polarity. For example, as shown in the configuration of FIG. 11, the first inner positive electrode terminal 511 may be connected to each of the first measuring lead 330, the second measuring lead 340 and the first electrode lead 310. Through this configuration, when the secondary battery 1 is charged/discharged, the first inner positive electrode terminal 511 may be electrically connected to all the first electrode plates 110 provided in the secondary battery 1.

The first inner negative electrode terminal 512 may be electrically connected to the second electrode lead 320. For example, as shown in the configuration of FIG. 11, the first inner negative electrode terminal 512 may be connected to the second electrode lead 320 one-to-one. Through this configuration, when the secondary battery 1 is charged/discharged, the first inner negative electrode terminal 512 may be electrically connected to all the second electrode plates 120 provided in the secondary battery 1.

Referring to FIG. 12, the inner measuring terminal according to an embodiment of the present disclosure may be electrically connected to the plurality of electrode leads 310, 320, 330, 340 of the secondary battery 1.

The second inner positive electrode terminal 521 may be electrically connected to the first electrode lead 310. More specifically, the second inner positive electrode terminal 521 may be connected to the first electrode lead 310 one-to-one.

The second inner negative electrode terminal 522 may be electrically connected to the second electrode lead 320. More specifically, the second inner negative electrode terminal 522 may be connected to the second electrode lead 320 one-to-one.

The first inner measuring terminal 523 may be electrically connected to the first measuring lead 330. More specifically, the first inner measuring terminal 523 may be connected to the first measuring lead 330 one-to-one.

The second inner measuring terminal 524 may be electrically connected to the second measuring lead 340. More specifically, the second inner measuring terminal 524 may be connected to the second measuring lead 340 one-to-one.

Through this configuration, the first inner measuring terminal 523 and the second inner measuring terminal 524 may be electrically connected to the first measuring electrode plate 130 and the second measuring electrode plate 140 provided in the electrode assembly 100 through the first measuring lead 330 and the second measuring lead 340 respectively.

Figure 13:
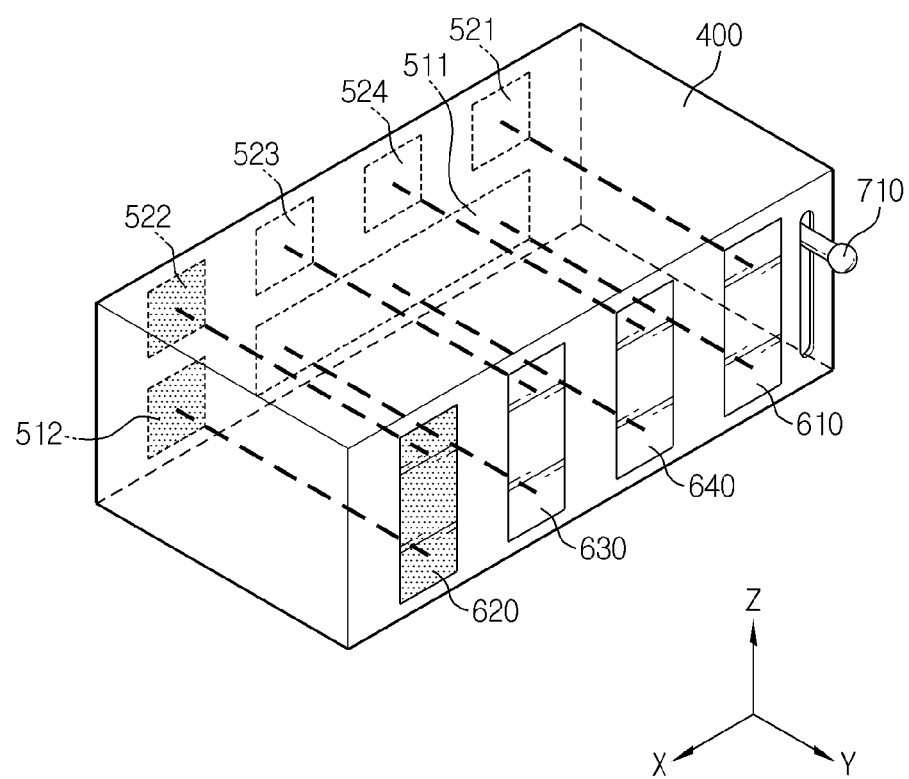
FIG. 13 is a schematic diagram showing connection between a plurality of inner terminals and a plurality of outer terminals provided in a terminal case according to an embodiment of the present disclosure.

FIG. 13 is a schematic diagram showing connection between the plurality of inner terminals 511, 512, 521, 522, 523, 524 and the plurality of outer terminals 610, 620, 630, 640 provided in the terminal case 400 according to an embodiment of the present disclosure.

Referring to FIG. 13, the plurality of inner terminals 511, 512, 521, 522, 523, 524 and the plurality of outer terminals 610, 620, 630, 640 may be electrically connected to each other.

The outer positive electrode terminal 610 may be electrically connected to each of the first inner positive electrode terminal 511 and the second inner positive electrode terminal 521. More specifically, when the terminal case 400 runs in the normal mode, the outer positive electrode terminal 610 may transmit and receive the charging/discharging current through the electrical circuit connected to the first inner positive electrode terminal 511. Additionally, when the terminal case 400 runs in the measurement mode, the outer positive electrode terminal 610 may transmit and receive the charging/discharging current through the electrical circuit connected to the second inner positive electrode terminal 521.

The outer negative electrode terminal 620 may be electrically connected to each of the first inner negative electrode terminal 512 and the second inner negative electrode terminal 522. More specifically, when the terminal case 400 runs in the normal mode, the outer negative electrode terminal 620 may transmit and receive the charging/discharging current through the electrical circuit connected to the first inner negative electrode terminal 512. Additionally, when the terminal case 400 runs in the measurement mode, the outer negative electrode terminal 620 may transmit and receive the charging/discharging current through the electrical circuit connected to the second inner negative electrode terminal 522.

The first outer measuring terminal 630 may be electrically connected to the first inner measuring terminal 523. More specifically, when the terminal case 400 runs in the measurement mode, the first outer measuring terminal 630 may be electrically connected to the first measuring electrode plate 130 through the electrical circuit connected to the first inner measuring terminal 523.

The second outer measuring terminal 640 may be electrically connected to the second inner measuring terminal 524. More specifically, when the terminal case 400 runs in the measurement mode, the second outer measuring terminal 640 may be electrically connected to the second measuring electrode plate 140 through the electrical circuit connected to the second inner measuring terminal 524.

Figure 14:
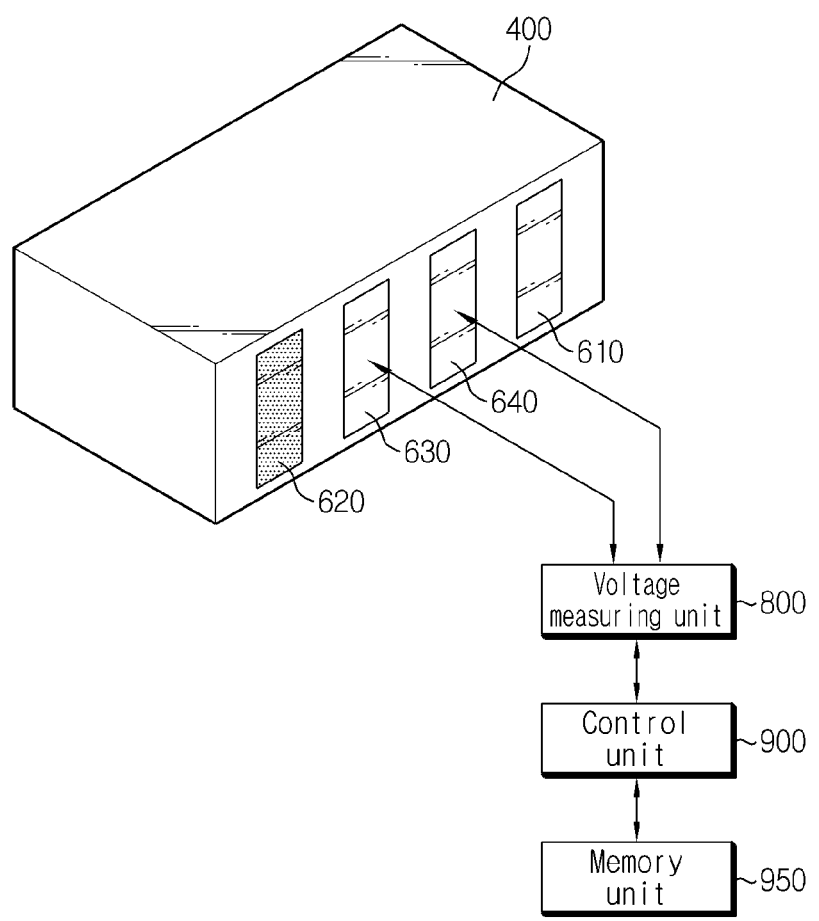
FIG. 14 is a schematic diagram showing parts of an apparatus for estimating a state of a secondary battery according to an embodiment of the present disclosure.

FIG. 14 is a schematic diagram showing parts of the apparatus for estimating the state of the secondary battery 1 according to an embodiment of the present disclosure.

Referring to FIG. 14, the voltage measuring unit 800 may be electrically connected to the first outer measuring terminal 630 and the second outer measuring terminal 640. Here, the first outer measuring terminal 630 is electrically connected to the first measuring electrode plate 130 through the first inner measuring terminal 523 and the first measuring lead 330. Additionally, the second outer measuring terminal 640 is electrically connected to the second measuring electrode plate 140 through the second inner measuring terminal 524 and the second measuring lead 340.

The voltage measuring unit 800 may measure the voltage of the first measuring electrode plate 130 by measuring the voltage applied to the first outer measuring terminal 630. Additionally, the voltage measuring unit 800 may measure the voltage of the second measuring electrode plate 140 by measuring the voltage applied to the second outer measuring terminal 640.

The voltage measuring unit 800 may measure the voltage applied to the first outer measuring terminal 630 and the voltage applied to the second outer measuring terminal 640 and transmit the measured voltage values to the control unit 900. Additionally, the control unit 900 may calculate a difference (i.e., a potential difference) between the two received voltage values, and estimate the SOH of the secondary battery 1 using the calculated potential difference. In this case, the control unit 900 may refer to the potential difference-SOH lookup table stored in the memory unit 950. For example, when a potential difference between the voltage value of the first measuring electrode plate 130 and the voltage value of the second measuring electrode plate 140 is 5 mV or more, the control unit 900 may estimate that the secondary battery is degraded.

Figure 15:
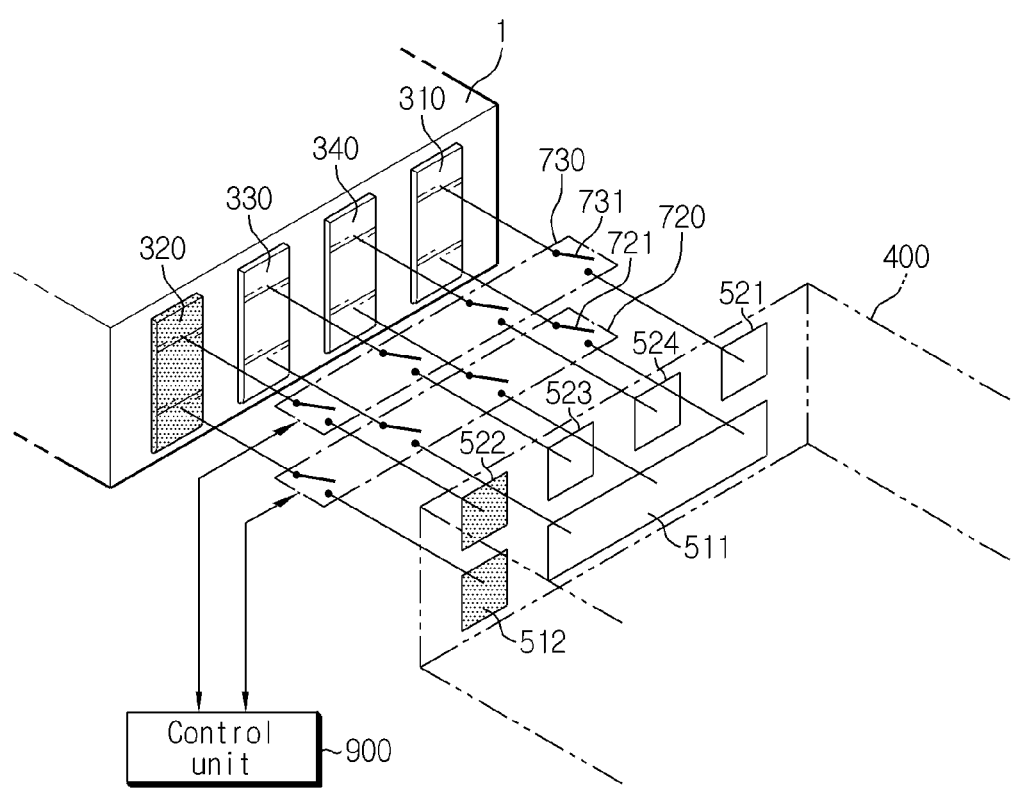
FIG. 15 is a schematic diagram showing a switching element connected between a plurality of electrode leads and a plurality of inner terminals according to an embodiment of the present disclosure.

FIG. 15 is a schematic diagram showing the switching element connected between the plurality of electrode leads 310, 320, 330, 340 and the plurality of inner terminals 511, 512, 521, 522, 523, 524 according to an embodiment of the present disclosure.

Referring to FIG. 15, the switching element 700 may be provided between the plurality of electrode leads 310, 320, 330, 340 and the plurality of inner terminals 511, 512, 521, 522, 523, 524. More specifically, the switching element 700 may be configured to selectively change the electrical connection between the plurality of electrode leads 310, 320, 330, 340 and the plurality of inner terminals 511, 512, 521, 522, 523, 524.

The switching element 700 may include a normal mode circuit 720 and a measurement mode circuit 730. The normal mode circuit 720 may include a plurality of unit switches 721 for normal mode. The measurement mode circuit 730 may include a plurality of unit switches 731 for measurement mode.

For example, as shown in the configuration of FIG. 15, the normal mode circuit 720 may electrically connect each of the plurality of electrode leads 310, 320, 330, 340 to the inner charging/discharging terminals 511, 512. More specifically, the unit switch 721 may be provided between the first electrode lead 310 and the first inner positive electrode terminal 511, to open/close the electrical circuit between the first electrode lead 310 and the first inner positive electrode terminal 511. Additionally, the unit switch 721 may be provided between the second electrode lead 320 and the first inner negative electrode terminal 512, to open/close the electrical circuit between the second electrode lead 320 and the first inner negative electrode terminal 512. Additionally, the unit switch 721 may be provided between the first measuring lead 330 and the first inner positive electrode terminal 511, to open/close the electrical circuit between the first measuring lead 330 and the first inner positive electrode terminal 511. Additionally, the unit switch 721 may be provided between the second measuring lead 340 and the first inner positive electrode terminal 511, to open/close the electrical circuit between the second measuring lead 340 and the first inner positive electrode terminal 511.

Additionally, the measurement mode circuit 730 may electrically connect each of the plurality of electrode leads 310, 320, 330, 340 to the inner measuring terminals 521, 522, 523, 524. More specifically, the unit switch 731 may be provided between the first electrode lead 310 and the second inner positive electrode terminal 521, to open/close the electrical circuit between the first electrode lead 310 and the second inner positive electrode terminal 521. Additionally, the unit switch 731 may be provided between the second electrode lead 320 and the second inner negative electrode terminal 522, to open/close the electrical circuit between the second electrode lead 320 and the second inner negative electrode terminal 522. Additionally, the unit switch 731 may be provided between the first measuring lead 330 and the first inner measuring terminal 523, to open/close the electrical circuit between the first measuring lead 330 and the first inner measuring terminal 523. Additionally, the unit switch 731 may be provided between the second measuring lead 340 and the second inner measuring terminal 524, to open/close the electrical circuit between the second measuring lead 340 and the second inner measuring terminal 524.

The control unit 900 may be connected to the normal mode circuit 720 and the measurement mode circuit 730 to transmit and receive electrical signals to/from them, to control the turn-on and/or turn-off operation of each unit switch 721 and each unit switch 731.

For example, when the terminal case 400 runs in the normal mode, the control unit 900 may turn on the normal mode circuit 720 and turn off the measurement mode circuit 730. Or, when the terminal case 400 runs in the measurement mode, the control unit 900 may turn off the normal mode circuit 720, and turn on the measurement mode circuit 730.

Additionally, when the control logics are implemented in software, the control unit may be implemented as a set of program modules. In this instance, the program module may be stored in the memory device and executed by the processor.

Additionally, at least one of the various control logics of the control unit may be combined, and the combined control logics are not limited to a particular type and include any type that can be written in computer-readable coding systems and read and accessed by the computer. For example, the recording media may include at least one selected from the group consisting of ROM, RAM, register, CD-ROM, magnetic tape, hard disk, floppy disk and an optical data recording device. Additionally, the coding systems may be stored and executed in computers connected via a network in distributed manner. Additionally, functional programs, codes and segments for implementing the combined control logics may be easily inferred by programs in the technical field pertaining to the present disclosure.

The apparatus 2 for secondary battery state estimation according to the present disclosure may be provided in a battery pack itself. That is, the battery pack according to the present disclosure may include the apparatus for secondary battery state estimation according to the present disclosure as described above. Here, the battery pack may include a plurality of secondary batteries, the apparatus for secondary battery state estimation, electricals (BMS, relay, fuse, etc.) and a case.

Meanwhile, the terms indicating directions such as up, down, left, right, front and rear are used herein, but they are for convenience of description only, and it is obvious to those skilled in the art that the term may change depending on the position of the stated element or an observer.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Meanwhile, the term 'unit' such as 'memory unit' and 'control unit' is used herein, but it is obvious to those skilled in the art that this indicates a logical component unit and does not necessarily indicate a component that may be or should be physically separated from other.

What is claimed is:

1. An apparatus for estimating a state of a secondary battery, connectable to a positive electrode lead, a negative electrode lead, a first measuring lead, and a second measuring lead included in the secondary battery, the apparatus comprising:
- a terminal case including:
  - a plurality of inner terminals, each configured to be contactable with the positive electrode lead, the negative electrode lead, the first measuring lead, or the second measuring lead on a first surface of the terminal case; and
  - a plurality of outer terminals configured to be respectively electrically connectable to the plurality of inner terminals on a second surface facing the first surface of the terminal case;
- a voltage measuring circuit configured to:
  - be electrically connected to at least two of the plurality of outer terminals; and
  - measure a potential difference between the first measuring lead and the second measuring lead; and
- a control circuit configured to estimate a state of health of the secondary battery based on the potential difference between the first measuring lead and the second measuring lead measured by the voltage measuring circuit, wherein:
the plurality of inner terminals includes inner charging/discharging terminals; and
the inner charging/discharging terminals include:
- a first inner positive electrode terminal configured to be connectable to each of the first measuring lead, the second measuring lead, and the positive electrode lead; and
- a first inner negative electrode terminal configured to be connectable to the negative electrode lead.

2. The apparatus according to claim 1, wherein:
the plurality of inner terminals further includes inner measuring terminals; and
the inner measuring terminals include:
- a second inner positive electrode terminal configured to be connectable to the positive electrode lead;
- a second inner negative electrode terminal configured to be connectable to the negative electrode lead;
- a first inner measuring terminal configured to be connectable to the first measuring lead; and
- a second inner measuring terminal configured to be connectable to the second measuring lead.

3. The apparatus according to claim 2, wherein the plurality of outer terminals includes:
- an outer positive electrode terminal electrically connectable to each of the first inner positive electrode terminal and the second inner positive electrode terminal; and
- an outer negative electrode terminal electrically connectable to each of the first inner negative electrode terminal and the second inner negative electrode terminal.

4. The apparatus according to claim 2, wherein the plurality of outer terminals includes:
- a first outer measuring terminal electrically connectable to the first inner measuring terminal; and
- a second outer measuring terminal electrically connectable to the second inner measuring terminal.

5. The apparatus according to claim 2, further comprising a switching element configured to selectively change the electrical connection between each of the negative electrode lead, the first measuring lead, the second measuring lead, and the positive electrode lead, and the plurality of inner terminals.

6. The apparatus according to claim 5, wherein:
the switching element includes:
- a normal mode circuit; and
- a measurement mode circuit;
the normal mode circuit is configured to electrically connect each of the negative electrode lead, the first measuring lead, the second measuring lead, and the positive electrode lead to a respective one of the inner charging/discharging terminals; and
the measurement mode circuit is configured to electrically connect each of the negative electrode lead, the first measuring lead, the second measuring lead, and the positive electrode lead to the inner measuring terminal.

7. The apparatus according to claim 5, wherein the control circuit is further configured to transmit at least one control signal to the switching element to control the switching element.

8. A battery pack comprising the apparatus according to claim 1.

* * * * *